United States Patent [19]

Ohira et al.

[11] Patent Number: 5,070,537
[45] Date of Patent: Dec. 3, 1991

[54] SYSTEM FOR DETECTING DEFECTIVE POINT ON POWER TRANSMISSION LINE BY UTILIZING SATELLITE

[75] Inventors: Sakari Ohira; Masatoshi Yamaki, both of Sendai; Akira Terashima, Miraka; Masaaki Ozawa, Hoya, all of Japan

[73] Assignees: Tohoku Electric Power Co., Inc., Sendai, Japan; Kyokuto Boeki Kaisha, Ltd., Tokyo, Japan

[21] Appl. No.: 445,647
[22] PCT Filed: Mar. 24, 1989
[86] PCT No.: PCT/JP89/00318
 § 371 Date: Nov. 24, 1989
 § 102(e) Date: Nov. 24, 1989
[87] PCT Pub. No.: WO89/09415
 PCT Pub. Date: Oct. 5, 1989

[30] Foreign Application Priority Data

Mar. 24, 1988 [JP] Japan .................................. 63-70395

[51] Int. Cl.[5] .................... H04B 17/00; G01R 31/08
[52] U.S. Cl. ........................ 455/67; 324/535; 455/12
[58] Field of Search ............. 455/67.12; 324/532, 324/535; 377/39

[56] References Cited

U.S. PATENT DOCUMENTS 4,792,963 12/1988 Campanella et al. ............ 375/109
4,932,070 6/1990 Waters et al. .................... 455/10

FOREIGN PATENT DOCUMENTS 0146516 11/1979 Japan ............................ 324/535
56-63274 5/1981 Japan .
0169779 9/1985 Japan ............................ 324/535
0215970 9/1986 Japan ............................ 324/532
63-206668 8/1988 Japan .

Primary Examiner—Reinhard J. Eisenzopf
Assistant Examiner—Chi H. Pham
Attorney, Agent, or Firm—Cushman, Darby & Cushman

[57] ABSTRACT

The invention relates to a system for detecting any defective point on a power transmission line by making use of highly-accurate time signal transmitted from a satellite and by utilizing a digital data processing system. The system comprises a master station and a subordinate station, each of the stations having a surge detection circuit capable of detecting a surge voltage generated as a result of cutting of a power transmission line, a GPS receiver for delivering a predetermined periodical pulse and a reset signal in accordance with the electric wave from a satellite, and a time counter/time base which is reset at a period of 1 second in accordance with the signal from the GPS receiver and which is capable of converting a pulse of a predetermined period derived from the GPS receiver into a binary-coded digital signal, the system further comprising modulation/demodulation means for enabling the digital signal generated by the time counter/time base to be transmitted from the subordinate station to the master station, and a processor controller provided in the master station and capable of conducting a comparison between the digital signals so as to determine the distance to the point at which the power transmission line is cut.

4 Claims, 4 Drawing Sheets

SYSTEM FOR DETECTING DEFECTIVE POINT ON POWER TRANSMISSION LINE BY UTILIZING SATELLITE

TECHNICAL FIELD

The present invention relates to a system for detecting any defective point on a power transmission line by making use of a highly-accurate time signal transmitted from a satellite and by utilizing a digital data processing system. In contrast to conventional analog type detection system which can provide a detection accuracy on the order of several kilo-meters at the highest, the detection system of the present invention enables detection at an accuracy on the order of several meters.

BACKGROUND ART

Detection systems which are presently available are classified into a surge-receiving-type detection system and a pulse-radar-type detection system.

The surge-receiving-type system can be sorted into a power-line transmission system and a microwave radio transmission system.

A description will be given of the construction and operation of conventional surge-receiving-type detection system.

FIG. 1 illustrates the construction of a detection system of a power-line transmission line (generally referred to as a "B-type system").

A power line is cut due to a thunder-bolt at a point marked by ① in this Figure. As a result of the cutting, a surge pulse is transmitted as indicated by ①→② and ①→③. The surge pulse received at a subordinate station is sent to a master station through a route ④→⑤. It is therefore necessary that the transmission delay time $t_3$ incurred during the surge pulse transmission ④→⑤ be exactly detected. In the master station, the time $t_1$ at which the surge pulse is received at the electric station A and the time which is obtained by subtracting the time $t_3$ from the time $t_2+t_2$ of the surge pulse received at the electric station B, i.e., the time $t_2$. and computes the distance between the station A (or the station B) and the point of cutting of the power line, in accordance with the result of the comparison. The computed distance is then delivered to, for example, an automatic printing device.

A description will be given of a detection system of the microwave radio transmission type.

FIG. 2 shows the construction of the detection system of the microwave radio transmission type (generally referred to as "micro-B-type").

This system is based on the same detection method as the power line transmission type system, but is different from the latter in that a microwave circuit is used as the means for transmitting the surge signal from a subordinate station to the master station.

In this system, 12 microwave circuits or so are exclusively used for this purpose.

On the other hand, the detection system of pulse radar type is as follows.

Namely, a detection pulse is transmitted through the power transmission line and the pulse reflected by the defective point is received so that the distance to the defective point is computed by measuring the time until the reflected pulse is received.

A description will be given of the drawback of the surge-receiving-type detection system.

The power-line transmission-type system, which is one of the surge-receiving-type system, has a drawback that it essentially requires a coupling device because this type of detection system utilizes the power transmission line a the detection circuit.

Another problem is that the exchange of the signal is impossible when the defect exists in the phase (one of three phases) used for the signal transmission. Thus, the probability of receipt of the signal is $\frac{2}{3}$.

In addition, error tends to be caused in the detection because of noises and surges which affect the detection signal.

Furthermore, it is necessary that the transmission delay time be exactly grasped. (Slight difference in the transmission delay time occurs to cause an error)

In order that the detection is conducted within a tolerance of 1 km, the change in the transmission delay time has to be within about 3 μsec as will be understood from the following equation.

Change in delay time
$$= 1\ km/300,000\ km\ \text{(velocity of light)} = 3\ \mu sec.$$

In addition, error tends to be caused in the detection time due to collapse of the waveform, because of the use of the analog signals. Namely, the waveform of the signal tends to be collapsed or deformed to make the rise of the signal dull particularly when the length of the transmission line is large, so as to make the detection difficult or to cause error in the detection.

Drawbacks of the detection system of the microwave transmission type are as follows.

It is necessary that a multiplexed microwave circuit for exclusive use has to be employed.

In addition, the rate of occupation of the circuits is large: namely, 12 circuits are exclusively used in general.

Furthermore, this type of detection system is difficult to maintain and requires a periodical check of the signal delay time which requires a special technique (certificate is necessary).

This type of system also suffers from the same problems caused by a change in the transmission delay time and by the collapse of the waveform, as in the case of the surge-receiving-type detection system.

Finally, the pulse-radar-type detection system suffers from the following problems.

Namely, waves reflected by stationary points such as the branches of the power transmission line are included. In addition, the detection pulse is attenuated particularly when the distance to the defective point is large. The detection, therefore, is rendered difficult and errors are often caused in the detection.

In addition, this system requires a coupling system for coupling a detection pulse to the power transmission line.

The pulse-radar-type detection system relies upon a principle which is fundamentally different from that of the detection system of the present invention, so that detailed description is omitted in regard to the construction of this type of system.

DISCLOSURE OF INVENTION

Accordingly, an object of the present invention is to provide a power transmission line defective point detection system which has a very high accuracy in time, i.e., which is capable of performing detection with reduced error, thereby overcoming the above-described problems of the prior art.

To this end, according to the present invention, there is provided a system for detecting a defective point on a power transmission line, the system comprising a master station and a subordinate station, each of the stations having a surge detection circuit capable of detecting a surge voltage generated as a result of cutting of a power transmission line, a GPS receiver for delivering a predetermined periodic pulse and a reset signal in accordance with an electric wave from a satellite, and a time counter/time base which is reset at a period of 1 second in accordance with the signal from the GPS receiver and which is capable of converting a pulse of a predetermined period derived from the GPS receiver into a binary-coded digital signal, the system further comprising a model for enabling the digital signal generated by the time counter/time base to be transmitted from the subordinate station to the master station, and a processor controller provided in the master station and capable of conducting a comparison between the digital signals so as to determine the distance to the point at which the power transmission line is cut.

THE BEST MODE FOR CARRYING OUT THE INVENTION

The present invention will be described with reference to the accompanying drawings.

First of all, a description will be given of the principle of the system of the present invention for detecting a defect point in power transmission line, with specific reference to the block diagram shown in FIG. 3.

The moments at which a surge pulse generated due to occurrence of an accident in a power transmission line reach both ends of the power transmission line are measured by clocks (clocks of a master station and a subordinate station which are synchronous with a timing signal transmitted from a satellite) which are installed independently on both ends of the power transmission line. The arrival time measured at one end (subordinate station) is transmitted by a suitable transmission means to the other (master station) for the purpose of comparison.

Unlike the conventional detection system, this transmission means is not required to transmit a detection pulse for the purpose of measurement of the arrival time, but is required only to inform the measured arrival time. Thus, the transmission means may be any suitable means such as a telephone or radio capable of transmitting an oral message.

Figure 1:
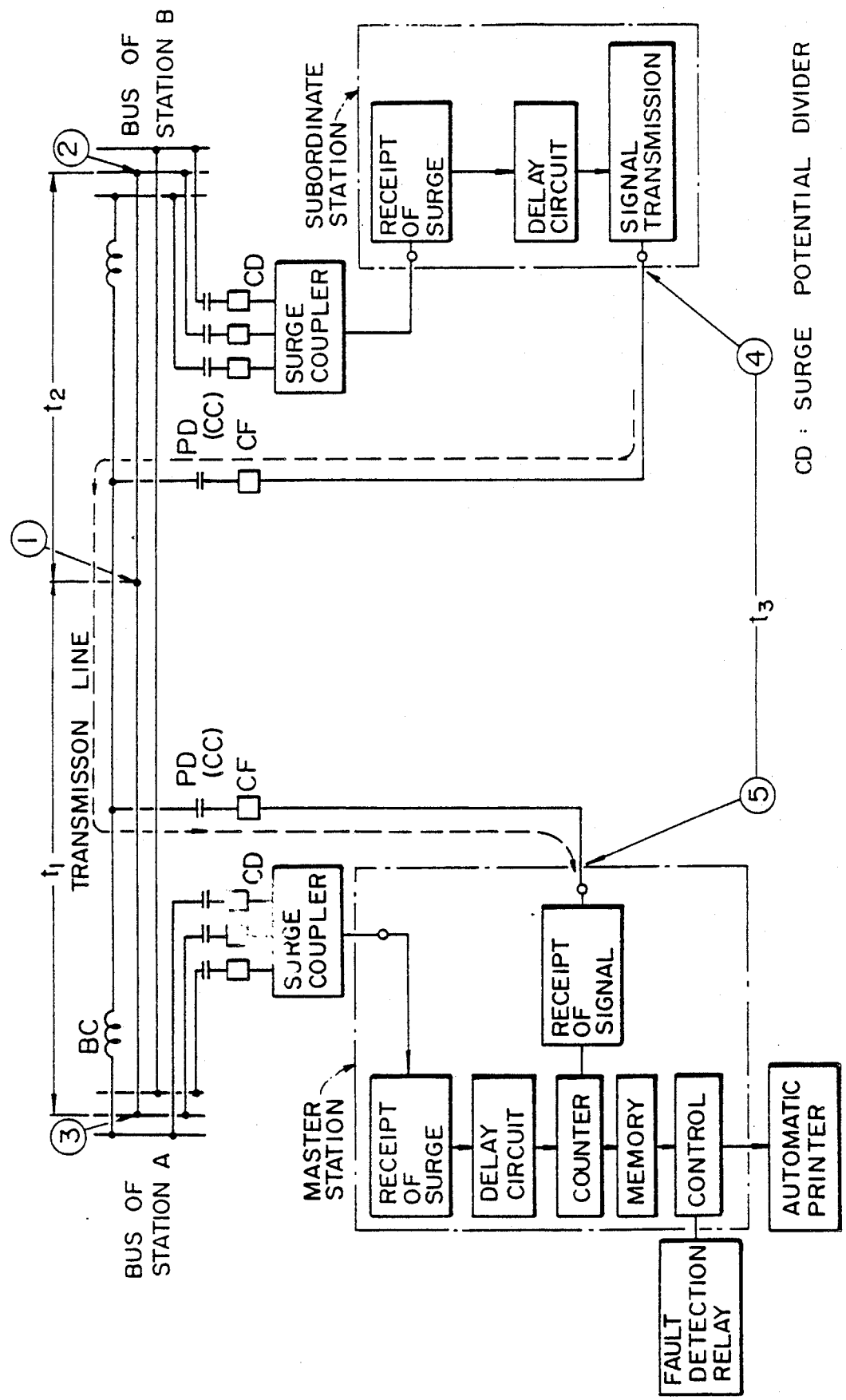
FIGS. 1 and 2 are schematic illustrations of conventional systems.
Figure 2:
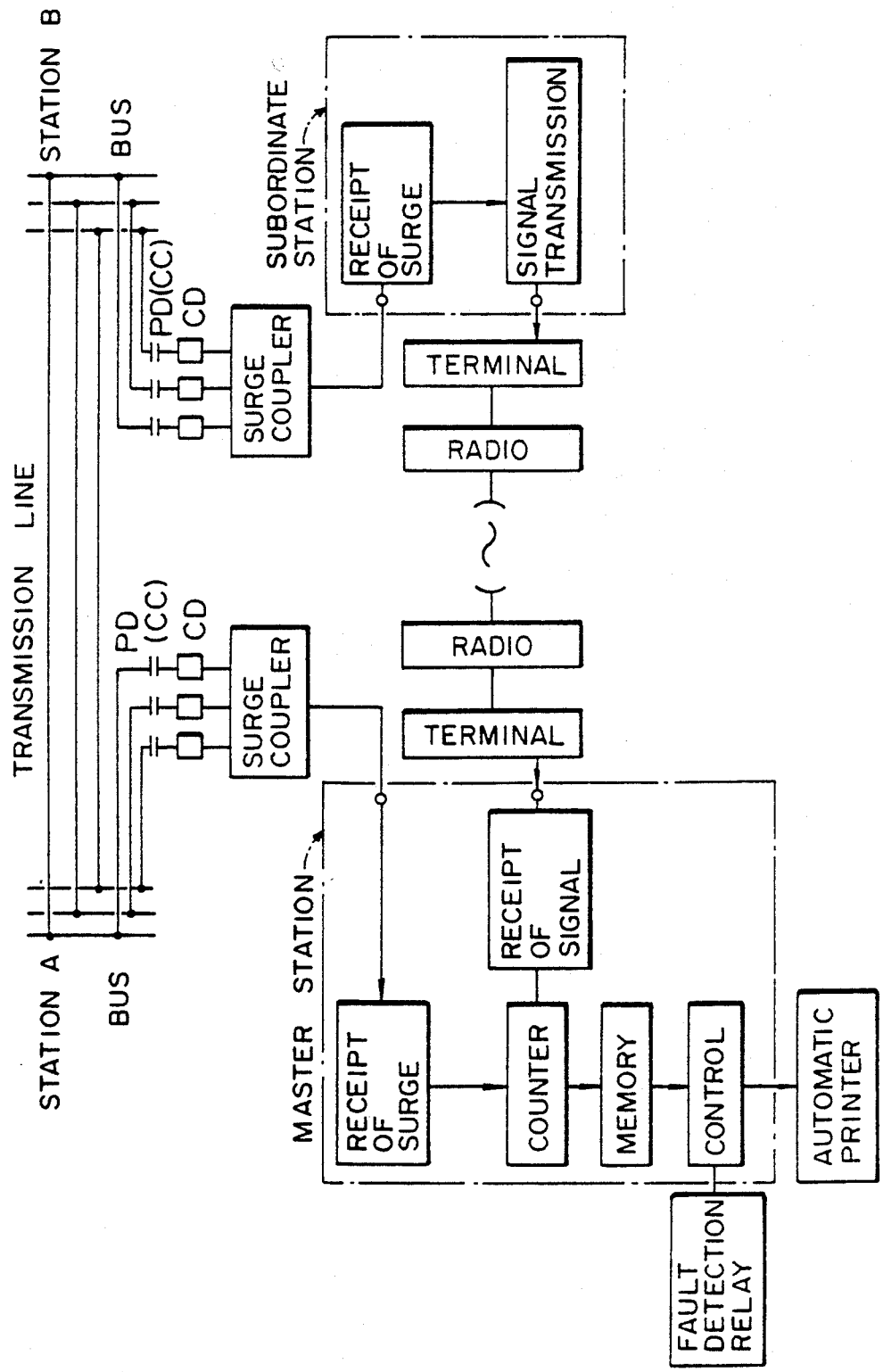
Figure 3:
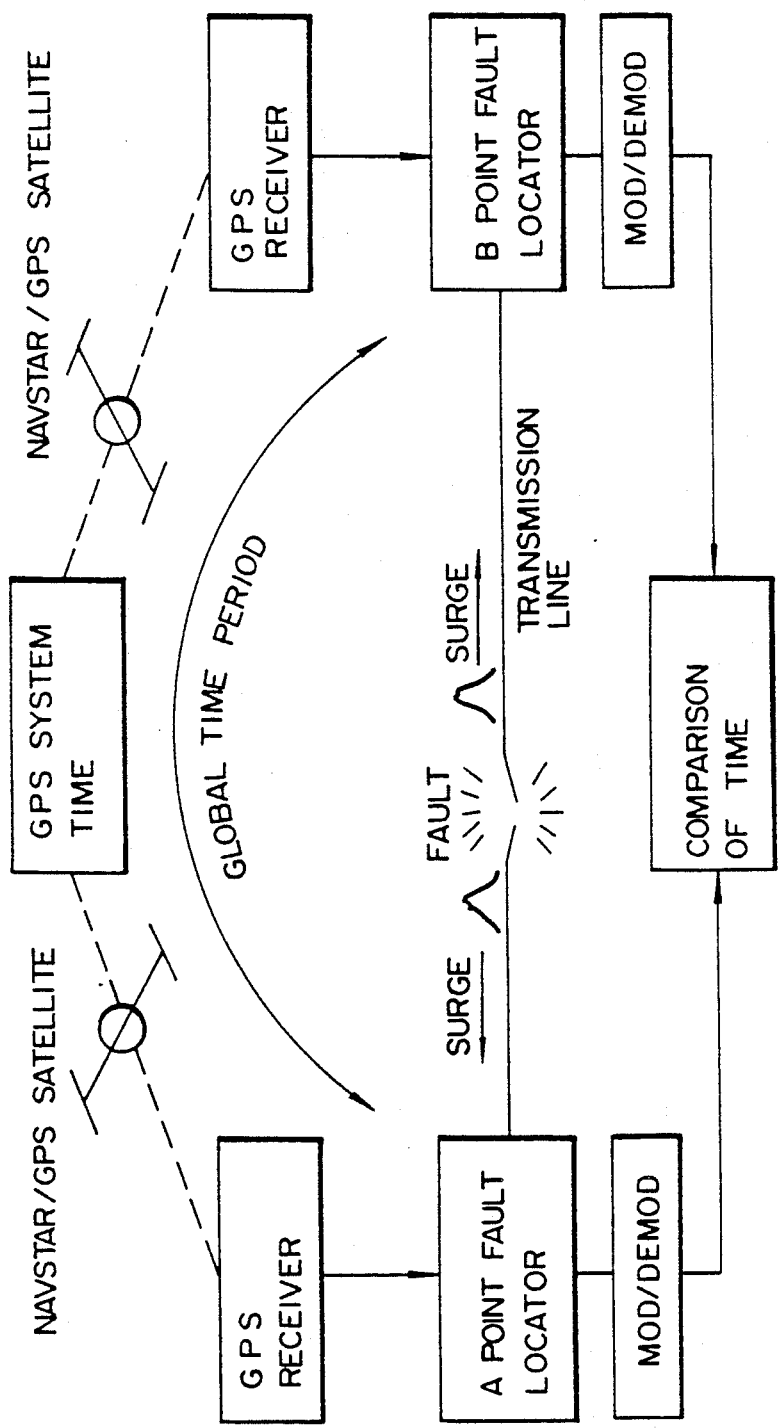
FIG. 3 is a schematic illustration of the principle of the present invention.

In the system shown in FIG. 3, a digital communication system with modulator/demodulator is used as the transmission means, since the subordinate station is assumed to be a remote unmanned station.

Representing the overall length of the power transmission line by L and the difference time between the surge arrival times by $\Delta t$, the distance X between the master station and the defective point on the power transmission line is determined by the following formula:

$$X = L + \Delta t c / 2 \text{ (c: velocity of light)}$$

A description will be given as to the synchronization of operation of this system with the timing signal transmitted from a satellite.

There is a system known as "Time Transfer System" in which a satellite transmits to the ground a signal which is controlled by an up-link from a ground station which keeps a reference time at a high accuracy so as to enable the user receiving this signal to set-up synchronization over a wide area. A system called GPS ("Global Positioning System") using a GPS satellite launched by the U.S.A. is now available as the time transfer system.

Each station can oscillate its oscillator in synchronization with the signal received from the satellite.

A detailed description will be given as to the manner in which a time synchronization is executed in regard to the GPS satellite.

The synchronization with the signal from the GPS satellite is conducted in the following manner.

The GPS satellite transmits two types of coded information collapsed "C/A code" (Coarse Acquisition Code) and "P code". The C/A code is available for civil uses.

These codes are generated by an oscillator based upon an atomic clock on the GPS satellite. A highly accurate clock becomes available by synchronization with the signal from this oscillator.

The C/A code is a 1,023-bit signal of a period of 1 MSEC and is transmitted through a phase modulation so as to be carried by a carrier wave of 1,572.42 MHz.

The delay of propagation of the electric wave from the satellite to the GPS receiver, delay due to ionosphere and atmosphere and other delay factors are corrected in the receiver in accordance with a satellite orbit element and correction model parameters which are transmitted from the satellite, whereby the time synchronism can be maintained with high degrees of stability and accuracy.

The synchronization with the C/A code transmitted from the satellite is conducted by generating, by an oscillator based on a clock in the receiver, a bit-pattern of the same C/A code as that from the satellite, multiplying the thus generated C/A code bit pattern with the received C/A code (through a correlation device), while shifting the phase of the oscillator in the receiver, so as to attain matching such that the maximum output is obtained.

The phase correction amount involves not only the above-mentioned delay times but also error of the clocks in the receiver. This error of the clock can be determined from the phase correction amount and the aforementioned delay error which are known by measurement and computation. In consequence, the clock in the receiver is corrected so as to become synchronous with the system time of the GPS with a tolerance of 10 nanoSec to 100 nanoSec.

The GPS receiver having the clock stabilized by the above-mentioned correction is used as a reference clock. Thus, the GPS receiver can generate signals of any desired frequency for use as clock signals.

A description will be given of the manner in which synchronization is attained between the counter time base and the timing pulse from the GPS receiver.

The time base of the counter is capable of generating a count frequency corresponding to the resolution of the counter. For instance, the count frequency has to be 10 MHz at the lowest, in order to obtain a resolution of 100 nanoSec ($10^{-7}$ Sec). The signal of this count frequency is changed into a signal of the same frequency as the reference pulse from the GPS receiver through a frequency-divider or a demultiplier. The phase and the frequency of this signal are compared with the reference pulse by means of a time-interval counter. The result is the comparison is fed back to the time base so that a high synchronization accuracy can be maintained.

A description will be given of the measurement of the time of arrival of the surge detection pulse.

An event pulse generated upon detection of arrival of the surge is used for latching the counter content at the moment of the arrival and triggers the counting operation of the microprocessor. The microprocessor reads the latched content. In the case of arrival at the subordinate station, the latched counter content is transmitted to the master station by a suitable communication means, whereas, in the case of arrival at the master station, the master station computes the difference between the counted number counted by the master station, itself and the counted number sent from the subordinate station. In the master station, the time difference is multiplied with the period of the count frequency, whereby the difference in the arrival time between both stations is determined.

Then, the position of the defective point is determined by the aforementioned formula and the thus determined defective position is delivered to a printer, a telecommunication system or other device.

Figure 4:
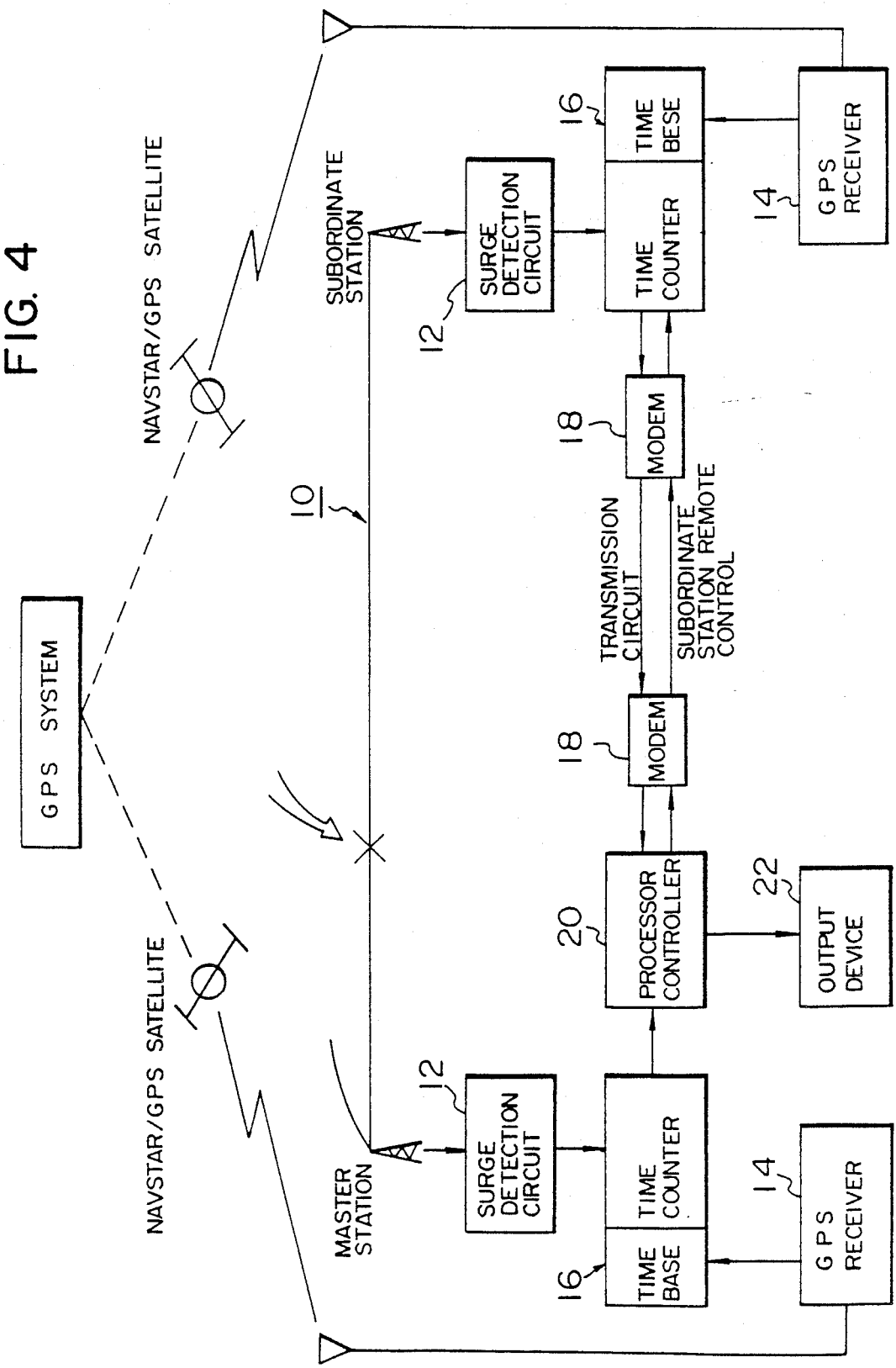
FIG. 4 is a block diagram of a system in accordance with the present invention.

A practical example of the detection system of the invention based upon the principle described hereinbefore will be explained with reference to FIG. 4.

The system 10 has the following components.

(1) Surge detection circuit 12

This circuit converts the high-voltage surge signal from the power transmission line into a signal of a level such as a TTL level which can be received by an electronic circuit.

(2) GPS receiver

This circuit supplies a time counter with a periodical pulse of 10 nSec (100 MHz) to 100 nSec (10 MHz) and also with a reset signal of 1 Hz.

(3) Time counter/Time base 16

This circuit is reset to initial state at a period of 1 second with 1 Hz reset pulse from a GPS receiver so as to convert the periodical pulse of 10 nSec (100 MHz) to 100 nSec (10 MHz) into a digital signal of, for example, binary code.

(4) Modulator/Demodulator 18

This device transmits the signal digitized by the time counter of the subordinate station to the master station through a communication line.

(5) Processor controller 20

This device conducts comparison between the signals digitized by the master and subordinate stations so as to determine the distance to the point where the power transmission line is cut and delivers the determined distance to an output device.

(6) Output device 22

This device is a printer, a CRT or the like, capable of recording or monitoring the distance to the point where the power transmission line is cut.

The present invention offers the following advantages.

Only one communication line is required. The communication line may be an inexpensive line and need not be an exclusive line.

Any type of communication system can be used because the data can have any desired form provided that it can indicate the time of arrival of the surge pulse.

In the event of a failure in the communication line, it is possible to store the result of the measurement in a memory device or the like and then transmit the measurement result after the recovery of the communication line.

The time base has an accuracy of 10 nanoSec to 100 nanoSec, thus offering a high accuracy of detection with a tolerance of 3 m to 30 m.

It is not necessary to transmit the surge pulse from the subordinate station, so that the timing can be measured with a high degree of accuracy without requiring any correction for distortion of the pulse wave or transmission delay time which has been necessary in the conventional system.

The system of the present invention offers the following remarkable advantage over the conventional systems.

The conventional systems make use of the power transmission line or a microwave circuit as means for transmitting the surge pulse received at the subordinate station to the master station.

In consequence, a distance correction error is inevitably incurred in the course of the transmission, however the distance between the subordinate and master stations may be measured accurately beforehand.

In the system of the present invention, in order to eliminate occurrence of error mentioned above, the signal indicative of the time of receipt of the surge pulse is converted into a digital amount such as a binary-coded amount, immediately after the receipt, and the thus obtained digital signal is transmitted from the subordinate station to the master station, whereby the correction error generated as a result of the transmission is avoided.

We claim:

1. A system for detecting a fault location on a power transmission line, said system comprising a master station, and a subordinate station electrically connected to said master station by a transmission circuit;

each of said master and subordinate stations comprising:

a surge detection circuit for detecting a surge voltage generated as a result of cutting of a power transmission line and producing a surge receiving signal indicative thereof;

a GPS receiver for receiving a transmission from a GPS satellite to generate predetermined periodic pulses, a reset signal, and GPS correction information based on said transmission;

a time counter/time base connected to said surge detection circuit and said GPS receiver for resetting a time period each time said reset signal is received from said GPS receiver, for converting said predetermined periodic pulses of said GPS receiver into a binary-coded digital signal representative of a time period since a reset, and for receiving said GPS correction information from said GPS receiver and responsively correcting said binary-coded digital signal to produce a corrected binary-coded digital signal said time counter/time base including means for latching said corrected binary-coded digital signal when said surge receiving signal is produced by said surge detection circuit, to generate a surge receiving time signal; and communication means, connected to a corresponding communications means at the other station through said transmission circuit, said communications means in said subordinate station for transmitting said surge receiving time signal generated in said subordinate station therefrom to said master station; and said master station further comprising a processor controller connected to said time counter/time base and said communication means for comparing said surge receiving time signal generated in said master station with said surge receiving time signal generated in said subordinate station and transmitted to said master station and for generating a signal representative of a distance to a fault point on said power transmission line based on said comparing.

2. A system as in claim 1, wherein said transmission from said GPS satellite includes a Coarse Acquisition code which is used to generate said periodic pulses and said reset signal, and a satellite orbit element, and correction model parameters which are used as said correction information.

3. A system as in claim 2, wherein said time counter time base includes an adjustable phase oscillator, an output of which is a code of a same type as a code of said Coarse Acquisition Code, and means for adjusting said phase to coincide with said phase of said Coarse Acquisition code.

4. A system as in claim 3, wherein said adjusting means includes a multiplier which multiplies said output of said oscillator by said received Coarse Acquisition code, and means for adjusting the phase of said oscillator to maximize an output of said multiplier.

* * * * *